United States Patent
Sung

(10) Patent No.: US 10,868,228 B2
(45) Date of Patent: Dec. 15, 2020

(54) SEMICONDUCTOR DEVICE

(71) Applicant: LG INNOTEK CO., LTD., Seoul (KR)

(72) Inventor: Youn Joon Sung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/536,512

(22) Filed: Aug. 9, 2019

(65) Prior Publication Data

US 2020/0052174 A1 Feb. 13, 2020

(30) Foreign Application Priority Data

Aug. 13, 2018 (KR) .................. 10-2018-0094410

(51) Int. Cl.
| | |
|---|---|
| *H01L 33/62* | (2010.01) |
| *H01L 33/46* | (2010.01) |
| *H01L 33/26* | (2010.01) |
| *H01L 33/10* | (2010.01) |

(52) U.S. Cl.
CPC .............. *H01L 33/62* (2013.01); *H01L 33/10* (2013.01); *H01L 33/26* (2013.01); *H01L 33/46* (2013.01)

(58) Field of Classification Search
CPC ......... H01L 33/62; H01L 33/46; H01L 33/26; H01L 33/10; H01L 33/405; H01L 33/60; H01L 33/486; H01L 33/32; H01L 33/22; H01L 33/382
See application file for complete search history.

(56) References Cited

U.S. PATENT DOCUMENTS

| 10,490,702 B2 * | 11/2019 | Park ..................... H01L 33/60 |
| 2012/0032218 A1 * | 2/2012 | Choi .................. H01L 33/0075 |
| | | 257/98 |
| 2013/0062638 A1 * | 3/2013 | Onushkin ............. H01L 33/382 |
| | | 257/98 |
| 2014/0339566 A1 * | 11/2014 | Seo ........................ H01L 33/42 |
| | | 257/76 |
| 2018/0019380 A1 * | 1/2018 | Kim ..................... H01L 33/382 |
| 2018/0069150 A1 * | 3/2018 | Oh ..................... H01L 33/0075 |
| 2018/0145219 A1 * | 5/2018 | Kim ....................... H01L 33/32 |
| 2018/0323341 A1 * | 11/2018 | Koo ....................... H01L 33/14 |
| 2019/0181300 A1 * | 6/2019 | Park ..................... H01L 33/387 |
| 2019/0237623 A1 * | 8/2019 | Sung .................... H01L 33/382 |
| 2019/0259910 A1 * | 8/2019 | Sung .................... H01L 33/405 |
| 2020/0066938 A1 * | 2/2020 | Seong .................... H01L 33/50 |

\* cited by examiner

*Primary Examiner* — Victor A Mandala
(74) *Attorney, Agent, or Firm* — KED & Associates, LLP

(57) ABSTRACT

Disclosed in an embodiment is a semiconductor device including a light-emitting structure which includes a first conductive semiconductor layer, a second conductive semiconductor layer, an active layer disposed between the first conductive semiconductor layer and the second conductive semiconductor layer, and a recess passing through the second conductive semiconductor layer, the active layer, and a portion of the first conductive semiconductor layer, a conductive layer electrically connected to the second conductive semiconductor layer, and a bonding pad disposed to be spaced apart from the light-emitting structure, wherein the active layer is divided into an inactive region and an active region by the recess, the conductive layer is electrically connected to the active region, and the conductive layer includes a stepped portion overlapping the recess in a vertical direction.

20 Claims, 10 Drawing Sheets

[FIG. 1]
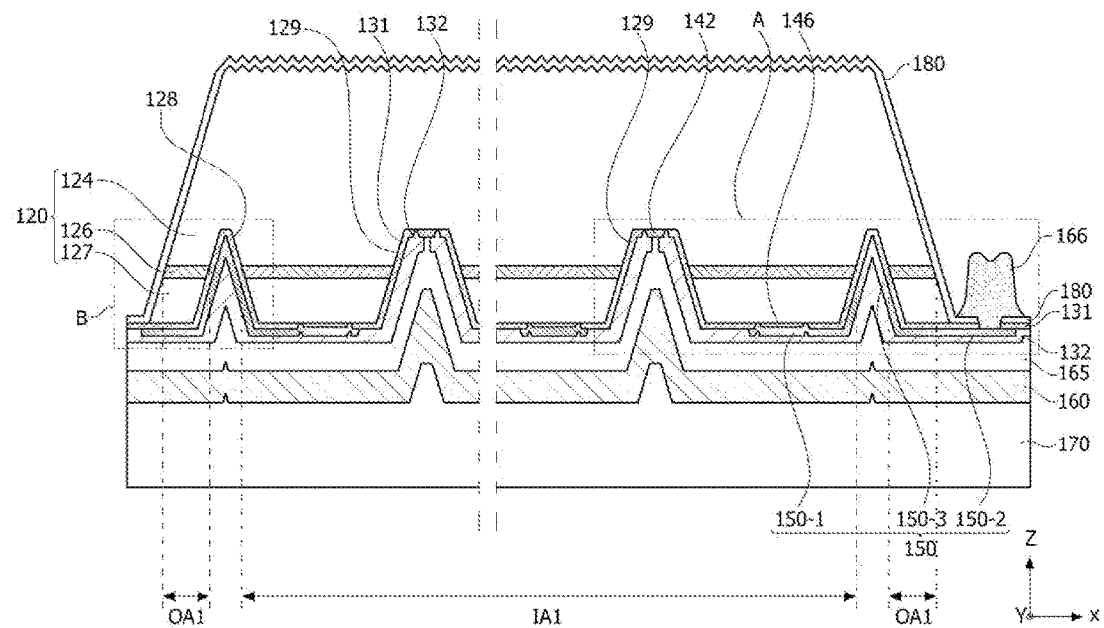
[FIG. 2]
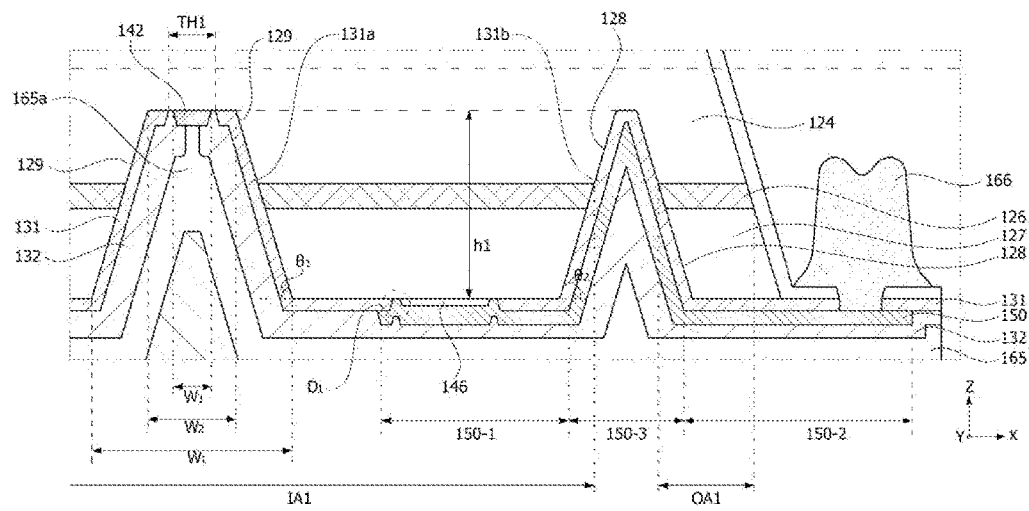

[FIG. 3]
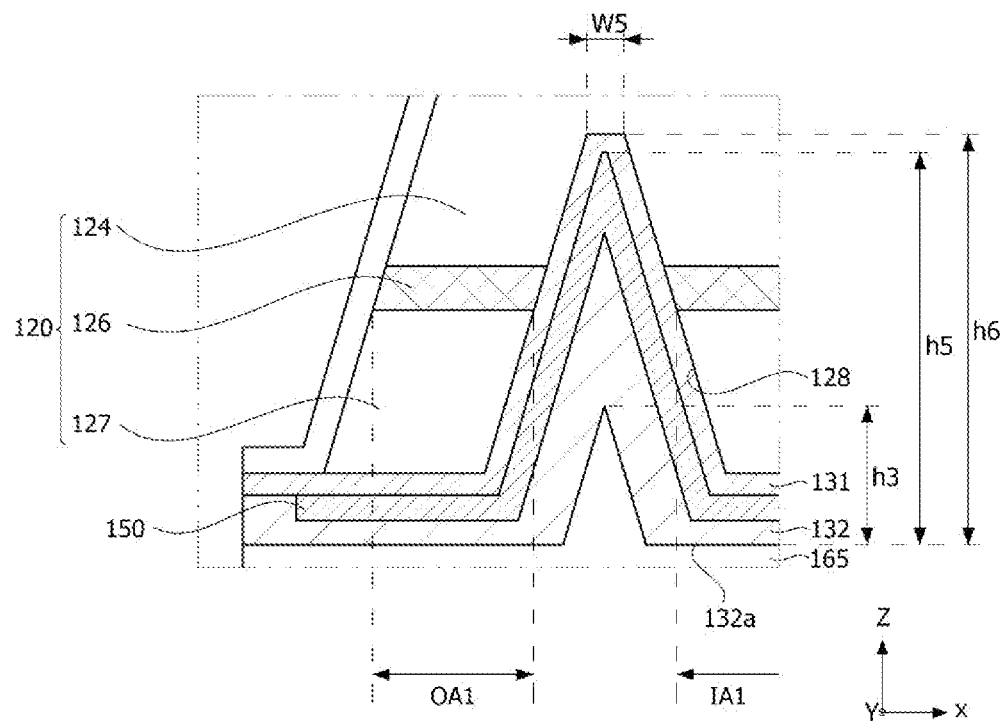
[FIG. 4]
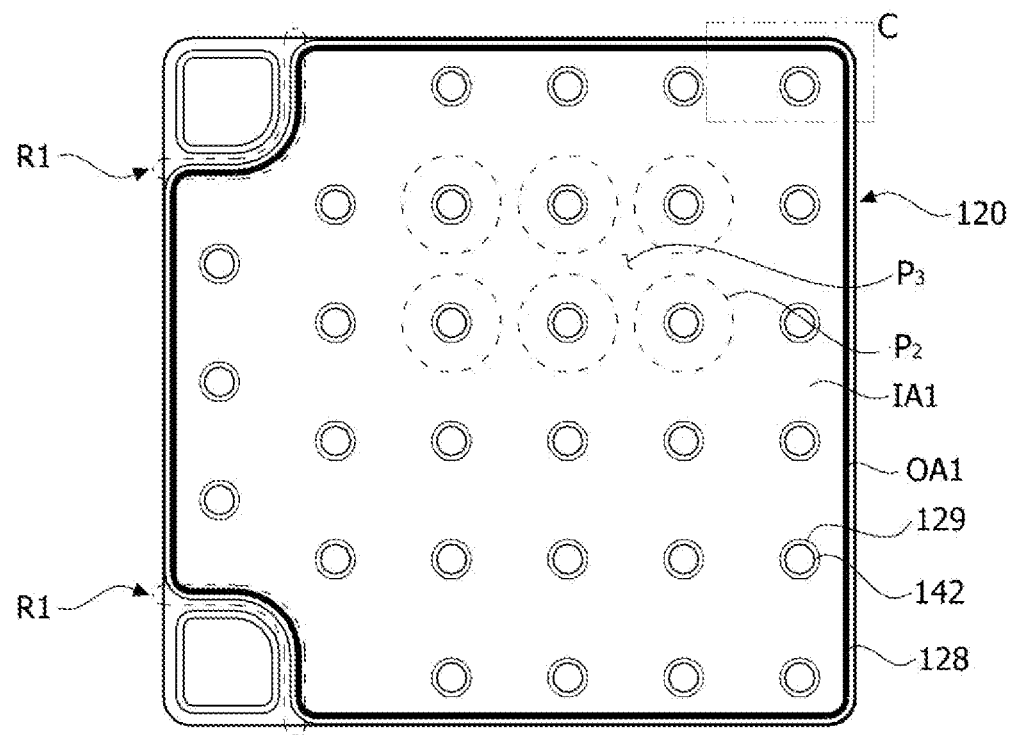

【FIG. 5】
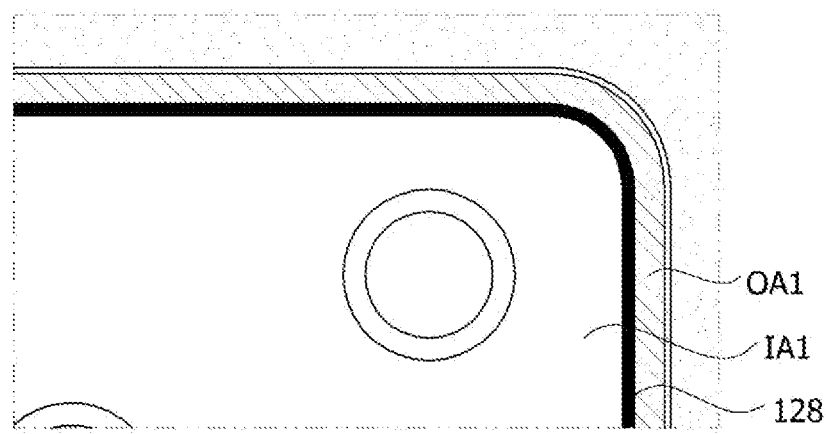
【FIG. 6】
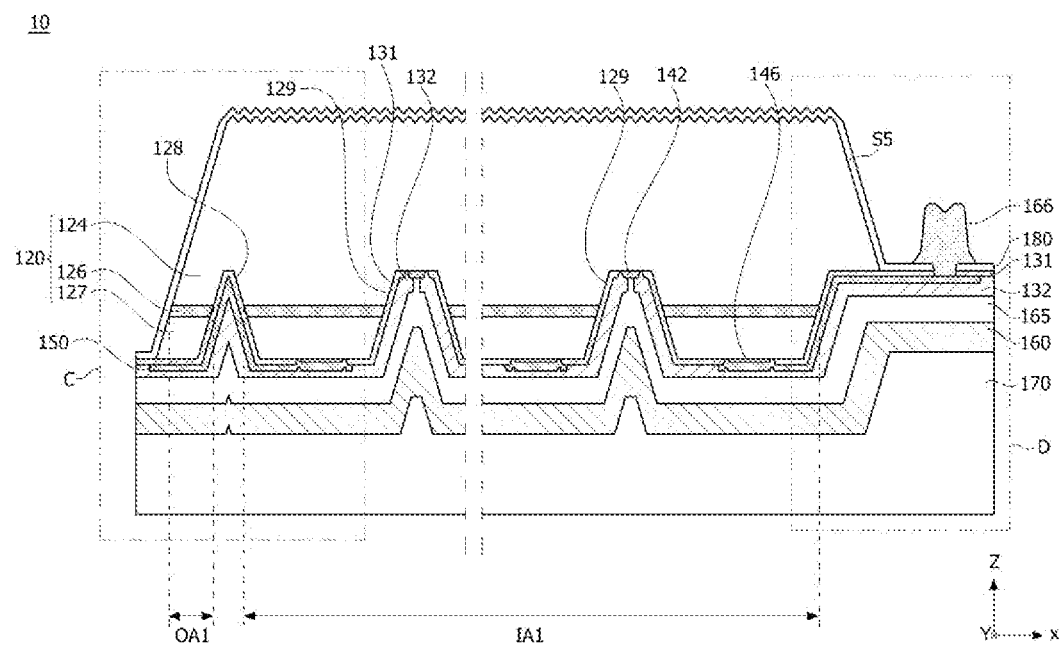

[FIG. 7]
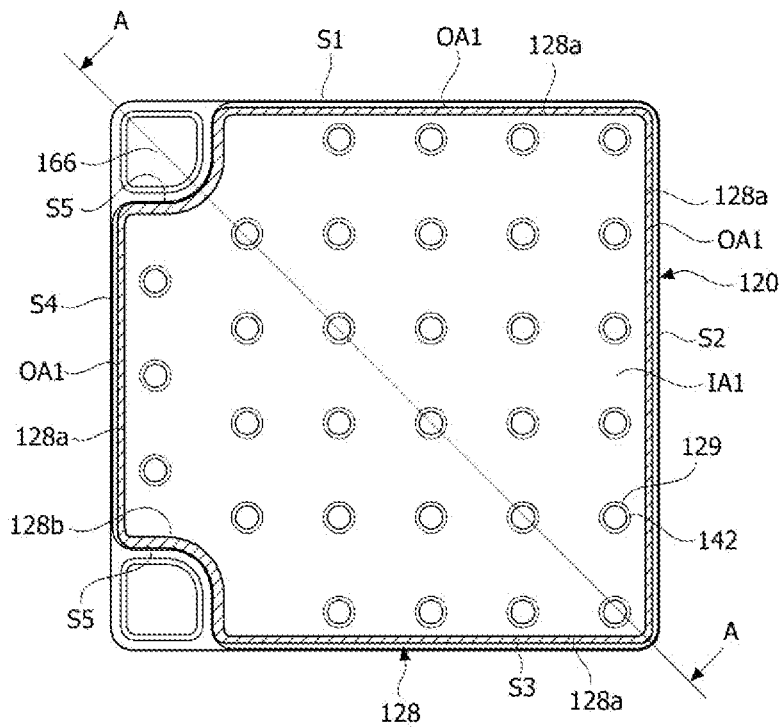
[FIG. 8A]
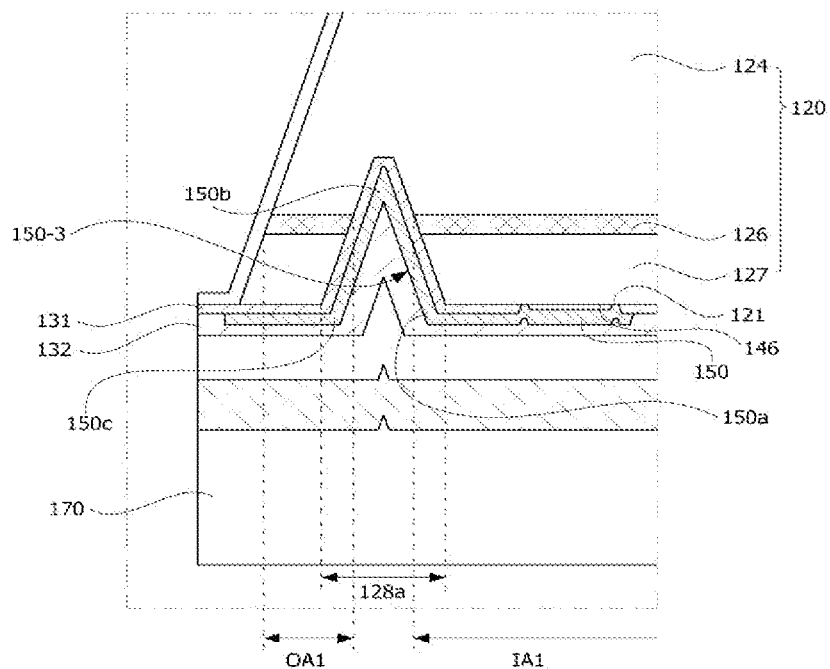

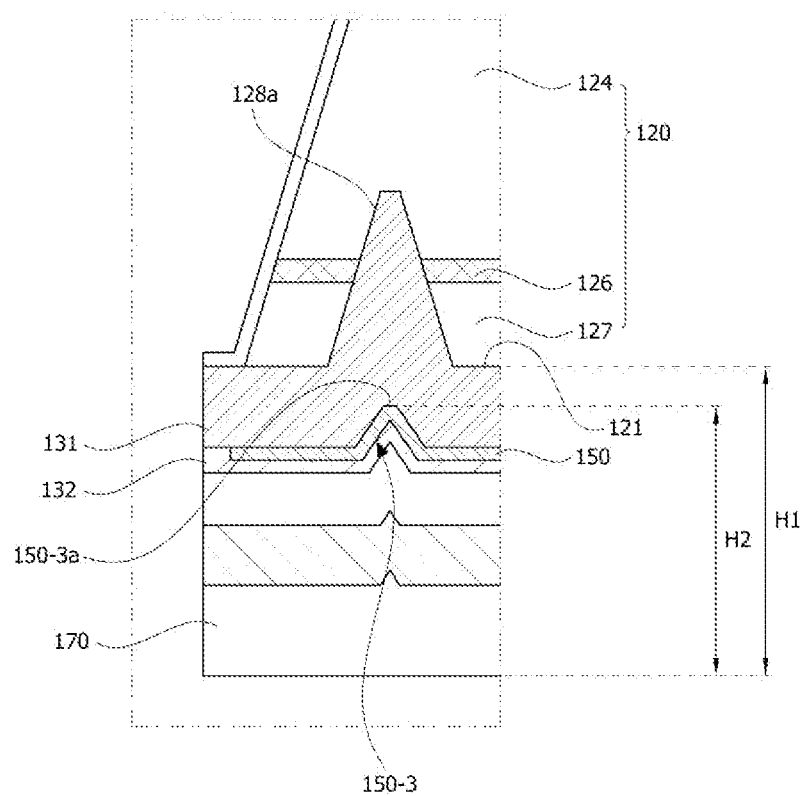
[FIG. 8B]

[FIG. 9]
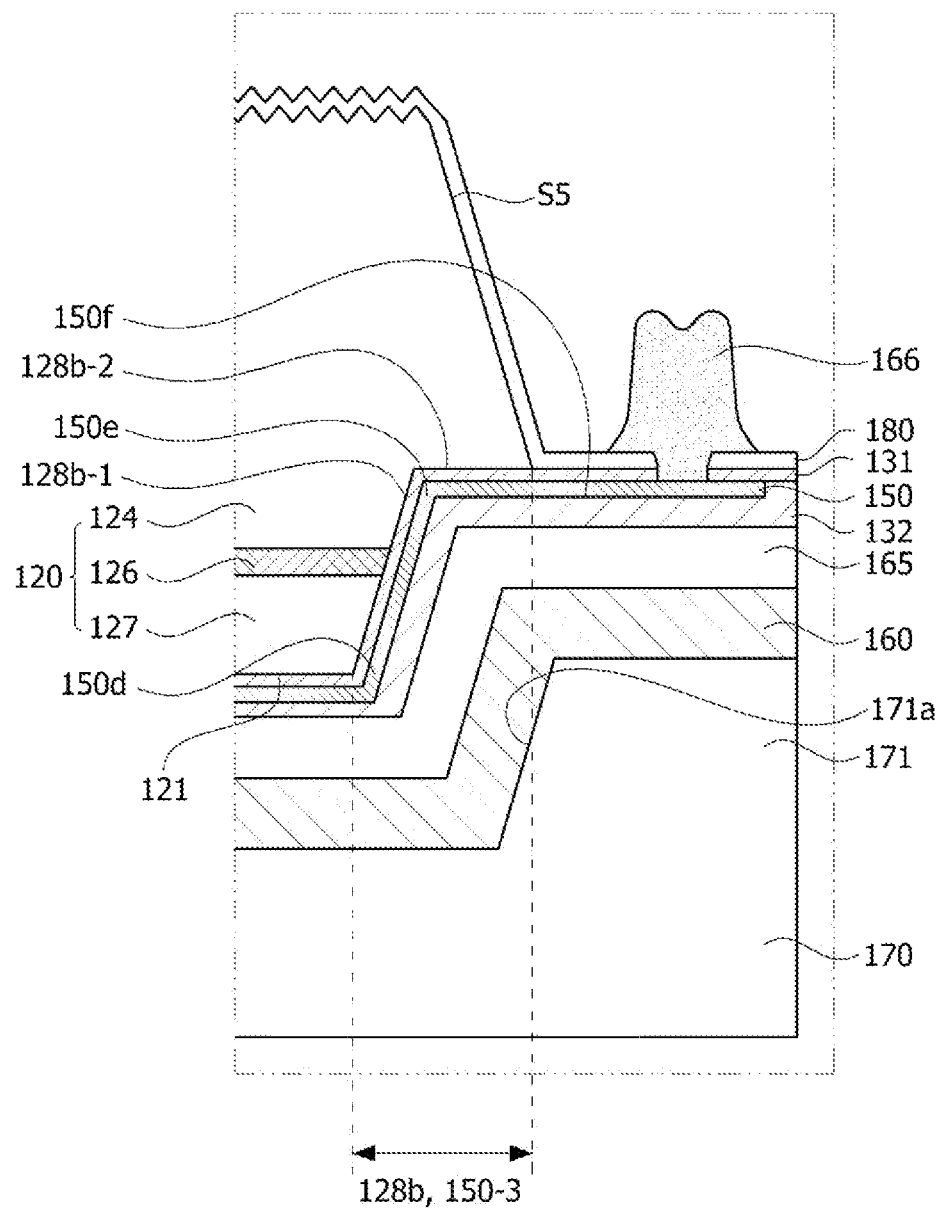

[FIG. 10]
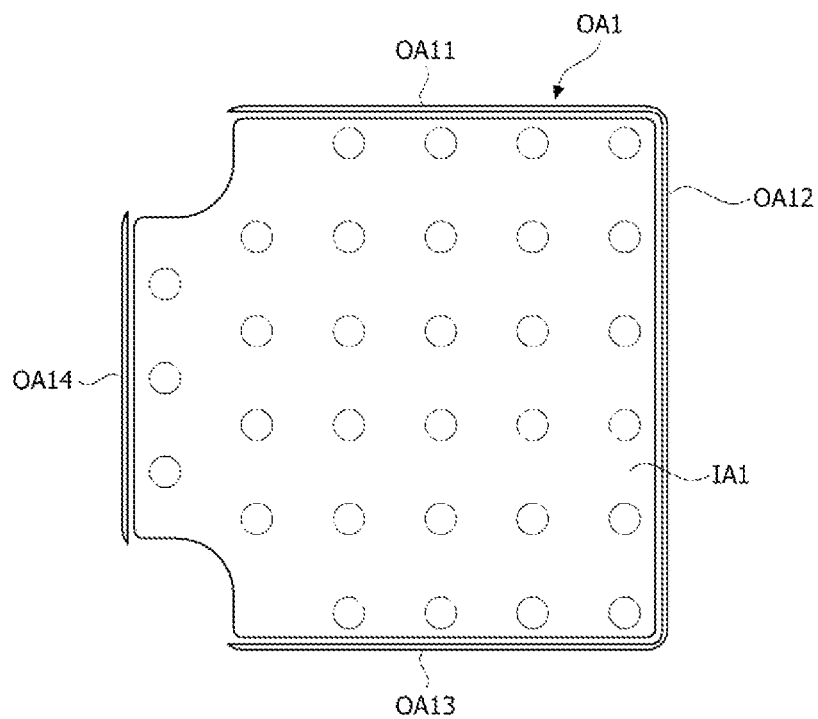
[FIG. 11]
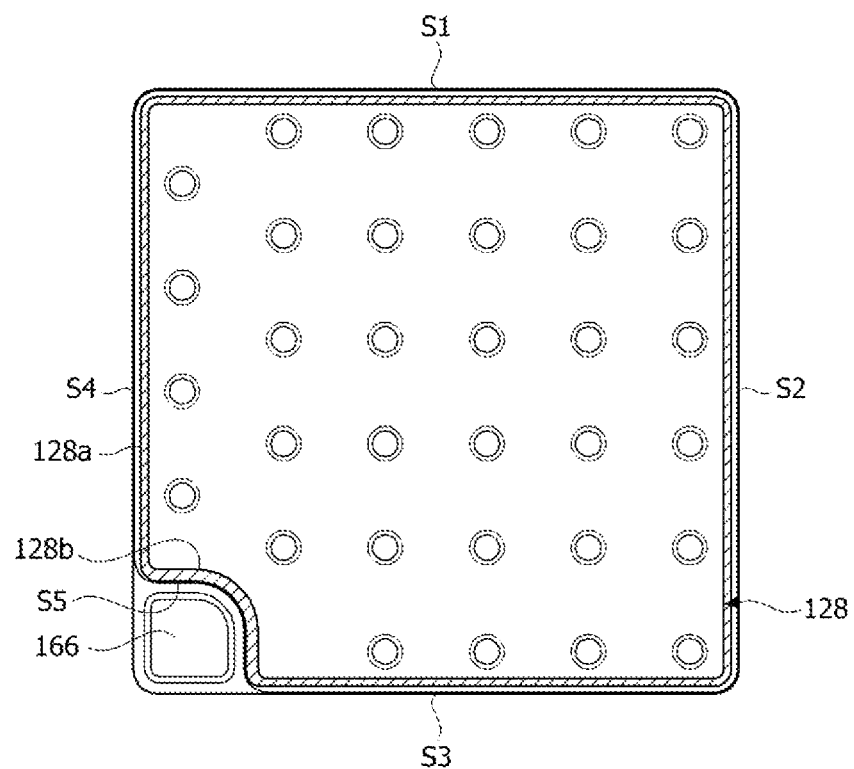

[FIG. 12]
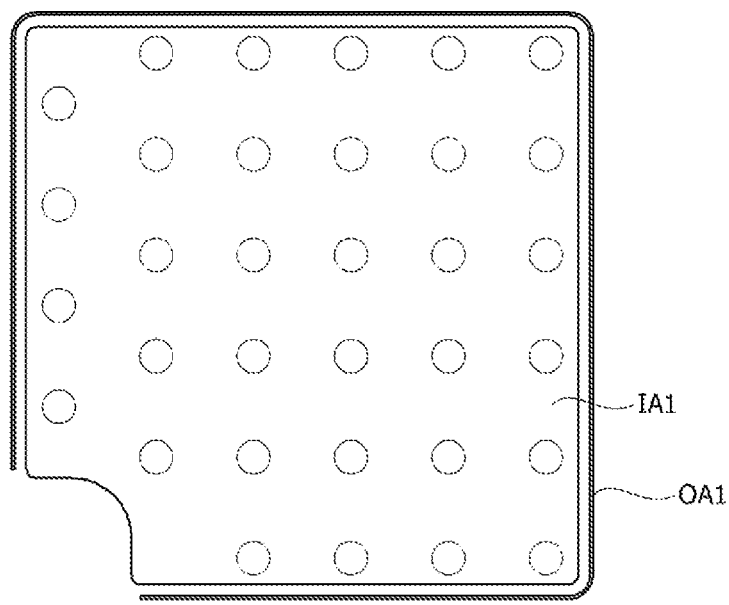
[FIG. 13]
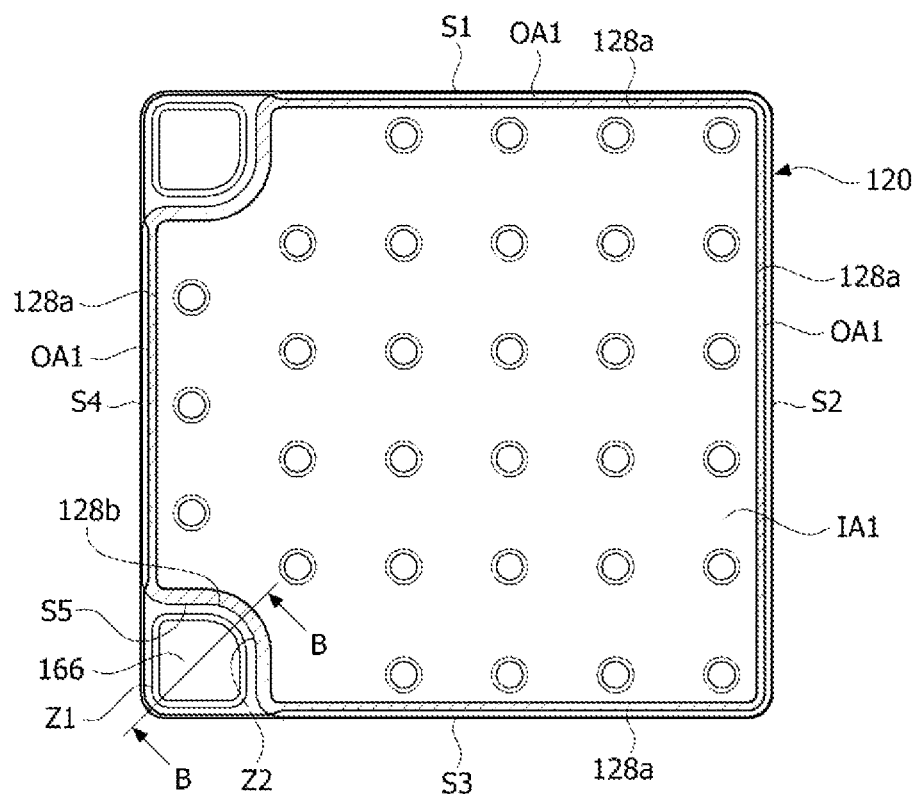

[FIG. 14]
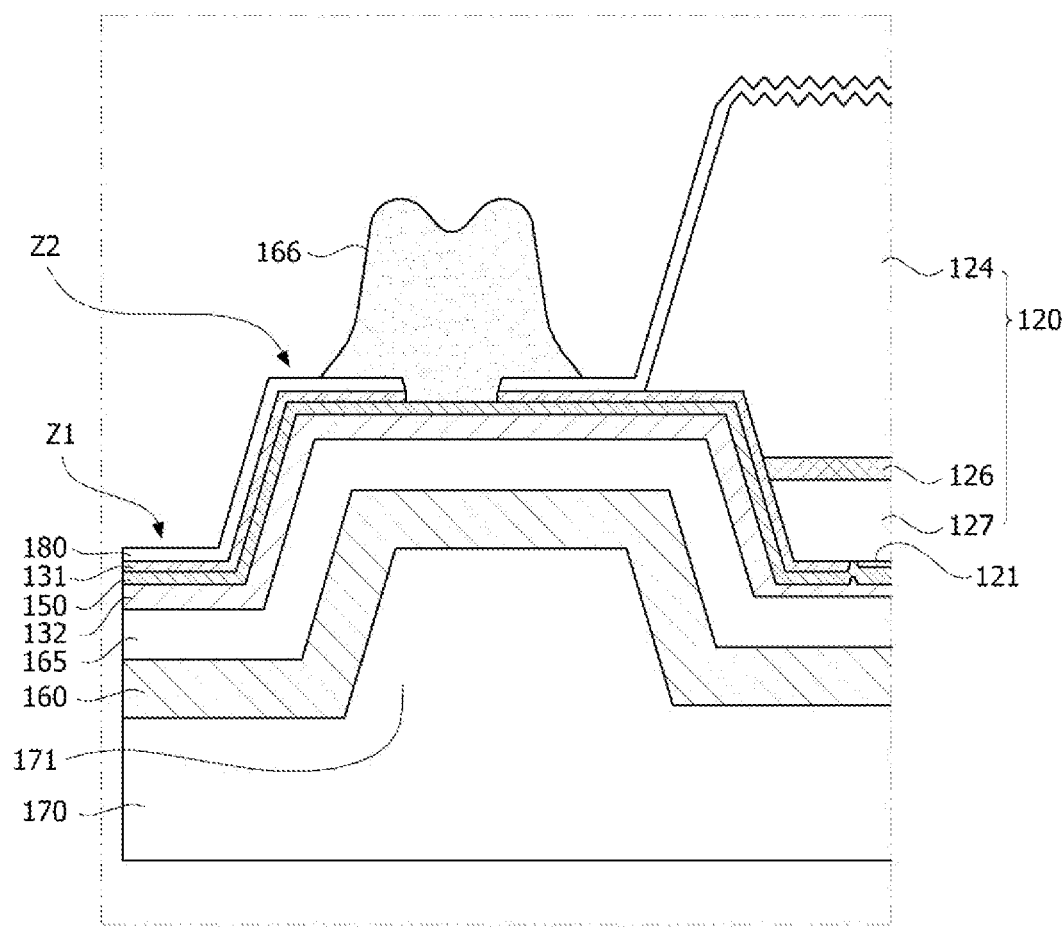
[FIG. 15]
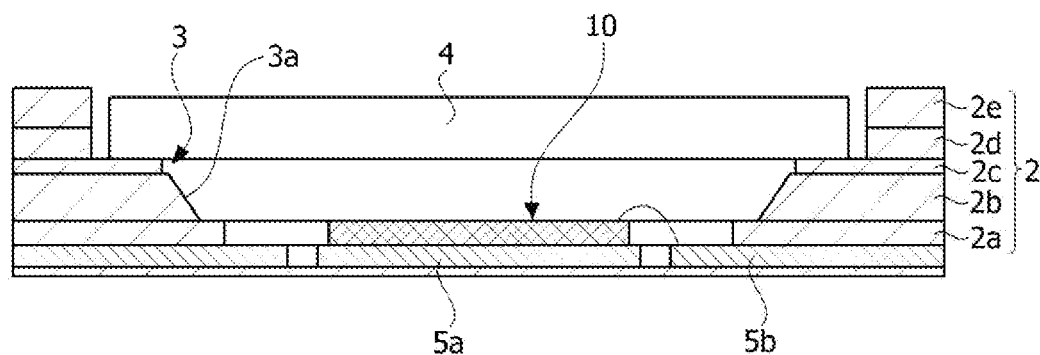

[FIG. 16]
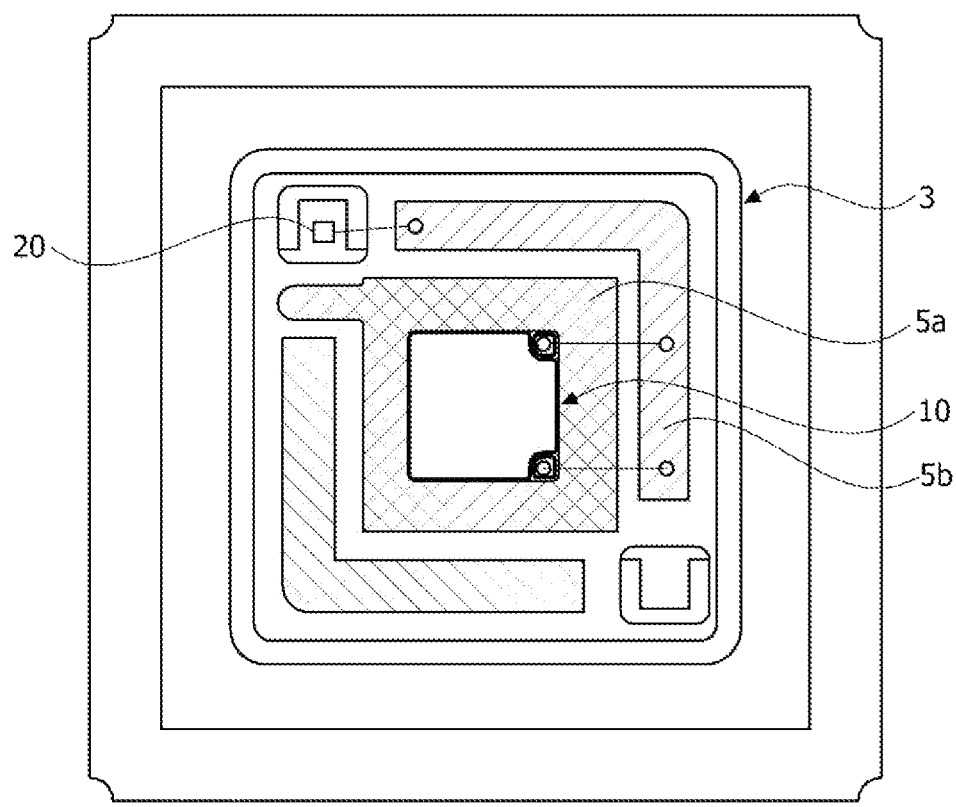

SEMICONDUCTOR DEVICE

CROSS-REFERENCE TO RELATED APPLICATION

This application claims priority to and the benefit of Korean Patent Application No. 10-2018-0094410, filed on Aug. 13, 2018, the disclosure of which is incorporated herein by reference in its entirety.

BACKGROUND

1. Field of the Invention

Embodiments of the present invention relate to a semiconductor device.

2. Discussion of Related Art

Semiconductor devices including compounds such as GaN, AlGaN, and the like can have many advantages such as wide and easily adjustable energy band gap and the like and can be variously used for light-emitting elements, light-receiving elements, and various diodes.

In particular, light-emitting elements such as light-emitting diodes or laser diodes using a compound semiconductor material including a III-V group element or a II-VI group element can realize various colors of light such as red light, green light, blue light, and ultraviolet light with the development of thin film growth technology and element materials and also realize white light having high efficiency by using a fluorescent material or combining colors. The light-emitting elements have advantages such as low power consumption, semi-permanent lifetime, fast response speed, safety, and environmental friendliness as compared to the conventional light sources such as fluorescent lamps, incandescent lamps, and the like.

In addition, light-receiving elements such as photodetectors or solar cells, which are manufactured using a compound semiconductor material including a III-V group element or a II-VI group element, can utilize light in various wavelength ranges from gamma rays to radio wavelengths by generating a photoelectric current by absorbing light in various wavelength ranges with the development of element materials. Further, the light-receiving elements have advantages such as fast response speed, safety, environmental friendliness, and simple control of element materials and thus can be easily used for power control, microwave circuits, or communication modules.

Therefore, semiconductor devices are increasingly applied to transmission modules of optical communication means, light-emitting diode backlights replacing cold-cathode fluorescent lamps (CCFLs) constituting backlights of liquid-crystal display (LCD) devices, white light-emitting diode lighting devices that can replace fluorescent lamps or incandescent bulbs, automotive headlights, traffic lights, and sensors that detect gas and fire. Further, the semiconductor devices can be widely applied to high frequency application circuits, other power control devices, and communication modules.

In particular, light-emitting elements that emit light in an ultraviolet wavelength range can be used for curing a liquid, medical usage, and sterilization by performing curing or sterilizing actions.

Recently, research on ultraviolet light-emitting elements has been actively conducted. However, there are problems in that the ultraviolet light-emitting elements are still difficult to realize in a vertical form and are oxidized by delamination and moisture so that light output is lowered.

SUMMARY OF THE INVENTION

Embodiments of the present invention are directed to providing a semiconductor device resistant to delamination and moisture.

Embodiments of the present invention are also directed to providing a semiconductor device with improved light emission uniformity.

Embodiments of the present invention are also directed to providing a semiconductor device having high light output.

It should be noted that objects of the present invention are not limited to the above-described objects, and other objects of the present invention will be apparent to those skilled in the art from the following descriptions.

One aspect of the present invention provides a semiconductor device including a light-emitting structure which includes a first conductive semiconductor layer, a second conductive semiconductor layer, an active layer disposed between the first conductive semiconductor layer and the second conductive semiconductor layer, and a recess passing through the second conductive semiconductor layer, the active layer, and a portion of the first conductive semiconductor layer, a conductive layer electrically connected to the second conductive semiconductor layer, and a bonding pad disposed to be spaced apart from the light-emitting structure, wherein the active layer is divided into an inactive region and an active region by the recess, the conductive layer is electrically connected to the active region, and the conductive layer includes a stepped portion overlapping the recess in a vertical direction.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIG. 1 is a conceptual diagram of a semiconductor device according to a first embodiment of the present invention;

FIG. 2 is an enlarged view of a portion A of FIG. 1;

FIG. 3 is an enlarged view of a portion B of FIG. 1;

FIG. 4 is a plan view of the semiconductor device according to the first embodiment of the present invention;

FIG. 5 is an enlarged view of a portion C of FIG. 4;

FIG. 6 is a cross-sectional view of a semiconductor device according to a second embodiment of the present invention;

FIG. 7 is a plan view of the semiconductor device according to the second embodiment of the present invention;

FIG. 8A is an enlarged view of a portion C of FIG. 6;

FIG. 8B shows a modified example of FIG. 8A;

FIG. 9 is an enlarged view of a portion D of FIG. 6;

FIG. 10 is a plan view showing an active region and an inactive region of an active layer;

FIG. 11 is a plan view of a semiconductor device according to a third embodiment of the present invention;

FIG. 12 is a plan view of an active layer;

FIG. 13 is a plan view of a semiconductor device according to a fourth embodiment of the present invention;

FIG. 14 is a cross-sectional view taken along line B-B of FIG. 13;

FIG. 15 is a conceptual diagram of a semiconductor device package according to an embodiment of the present invention; and FIG. 16 is a plan view of a semiconductor device package according to an embodiment of the present invention.

DETAILED DESCRIPTION OF EXEMPLARY EMBODIMENTS

Hereinafter, exemplary embodiments of the present invention will be described in detail with reference to the accompanying drawings.

However, it should be understood that the technical spirit of the present invention is not limited to embodiments to be disclosed below but may be implemented in many different forms. It should be understood that within the scope of the present invention, one or more elements of each of the embodiments may be selectively combined and substituted.

In addition, the terms (including technical and scientific terms) used in the embodiments of the present invention have the same meaning as commonly understood by one of ordinary skill in the art to which the present invention belongs. It should be further understood that terms, such as those defined in commonly used dictionaries, should be interpreted as having a meaning that is consistent with their meaning in the context of the related art.

Further, the terms used in the embodiments of the present invention are provided only to describe embodiments of the present invention and not for purposes of limitation.

In this specification, the singular forms include the plural forms unless the context clearly indicates otherwise, and the phrase "at least one element (or one or more elements) of an element A, an element B, and an element C," should be understood as including the meaning of at least one of all combinations being obtained by combining the element A, the element B, and the element C.

Further, in describing elements of the present invention, terminologies such as first, second, A, B, (a), and (b) may be used.

The term is used to distinguish an element from another element but a nature, an order, or a sequence of the elements is not limited by the terminology.

It will be understood that when an element is referred to as being "connected" or "coupled" to another element, it can be directly connected or coupled to another element, intervening elements may be present, or it can be connected or coupled to another element through the other element.

Further, when an element is described as being formed "on (above)" or "under (below)" another element, the term "on (above)" or "under (below)" includes both of a case in which two elements are in direct contact with each other or a case in which one or more elements are (indirectly) disposed between two elements. In addition, the term "on (above)" or "under (below)" includes a case in which another element is disposed in an upward direction or a downward direction with respect to one element.

A light-emitting structure according to an embodiment of the present invention may output light in an ultraviolet (UV) wavelength range. For example, the light-emitting structure may output light (UV-A) in a near UV wavelength range, output light (UV-B) in a far UV wavelength range, and output light (UV-C) in a deep UV wavelength range. The wavelength range may be determined by a composition ratio of aluminum (Al) of the light-emitting structure. Further, the light-emitting structure may emit light of various wavelengths having different intensities, and a peak wavelength, which has the highest intensity relative to other wavelengths, among wavelengths of emitted light may be a wavelength of near UV light, far UV light, or deep UV light.

For example, the light (UV-A) in a near UV wavelength range may have a main peak in a range of 320 nm to 420 nm, the light (UV-B) in a far UV wavelength range may have a main peak in a range of 280 nm to 320 nm, and the light (UV-C) in a deep UV wavelength range may have a main peak in a range of 100 nm to 280 nm. The light-emitting structure may generate UV light having a maximum peak wavelength in a wavelength range of 100 nm to 420 nm.

FIG. 1 is a conceptual diagram of a semiconductor device according to a first embodiment, FIG. 2 is an enlarged view of a portion A of FIG. 1, and FIG. 3 is an enlarged view of a portion B of FIG. 1.

Referring to FIGS. 1 and 2, a semiconductor device 10 according to the embodiment may include a light-emitting structure 120 including a conductive substrate 170, a first conductive semiconductor layer 124, a second conductive semiconductor layer 127, and an active layer 126, a first electrode 142 electrically connected to the first conductive semiconductor layer 124, and a second electrode 146 electrically connected to the second conductive semiconductor layer 127.

The first conductive semiconductor layer 124 may be implemented with a compound semiconductor including a III-V group element, a II-VI group element, or the like and may be doped with a first dopant. The first conductive semiconductor layer 124 may be selected from semiconductor materials having a composition formula of $In_{x1}Al_{y1}Ga_{1-x1-y1}N$ ($0 \leq x1 \leq 1$, $0 \leq y1 \leq 1$, and $0 \leq x1+y1 \leq 1$), for example, AlGaN, InGaN, InAlGaN, and the like. Further, the first dopant may be an N-type dopant such as Si, Ge, Sn, Se, or Te. When the first dopant is an N-type dopant, the first conductive semiconductor layer 124 doped with the first dopant may be an N-type semiconductor layer.

The active layer 126 may be disposed between the first conductive semiconductor layer 124 and the second conductive semiconductor layer 127. The active layer 126 may be a layer in which electrons (or holes) injected from the first conductive semiconductor layer 124 and holes (or electrons) injected from the second conductive semiconductor layer 127 are recombined.

In the active layer 126, as the electrons and the holes are recombined, the electrons may transition to a lower energy level and light having a wavelength corresponding to an energy band gap of a well layer included in the active layer 126, which will be described below, may be generated. Light of a wavelength having the highest intensity relative to other wavelengths, among wavelengths of light emitted from the semiconductor device, may be UV light, and the UV light may be near UV light, far UV light, or deep UV light.

The active layer 126 may have any one of a single well structure, a multi-well structure, a single quantum well (SQW) structure, a multiple quantum well (MQW) structure, a quantum dot structure, and a quantum wire structure, and the structure of the active layer 126 is not limited thereto.

The second conductive semiconductor layer 127 may be formed on the active layer 126 and implemented with a compound semiconductor including a III-V group element, a II-VI group element, or the like, and the second conductive semiconductor layer 127 may be doped with a second dopant. The second conductive semiconductor layer 127 may be formed of a semiconductor material having a composition formula of $In_{x5}Al_{y2}Ga_{1-x5-y2}N$ ($0 \leq x5 \leq 1$, $0 \leq y2 \leq 1$, and $0 \leq x5+y2 \leq 1$) or a material selected from the group consisting of AlGaN, AlInN, AlGaAs, GaP, GaAs, GaAsP, and AlGaInP. When the second dopant is a P-type dopant such as Mg, Zn, Ca, Sr, Ba, or the like, the second conductive semiconductor layer 127 doped with the second dopant may be a P-type semiconductor layer.

An electron blocking layer (not shown) may be disposed between the active layer 126 and the second conductive semiconductor layer 127. The electron blocking layer (not shown) may block electrons, which are supplied from the first conductive semiconductor layer 124 to the active layer 126, to flow out to the second conductive semiconductor layer 127 while not being emitted without being recombined in the active layer 126, and thus the recombination probability of electrons and holes in the active layer 126 may be increased. An energy band gap of the electron blocking layer (not shown) may be greater than an energy band gap of the active layer 126 and/or the second conductive semiconductor layer 127.

The first conductive semiconductor layer 124, the active layer 126, and the second conductive semiconductor layer 127 may all include aluminum (Al). Therefore, compositions of the first conductive semiconductor layer 124, the active layer 126, and the second conductive semiconductor layer 127 may all be AlGaN. However, the present invention is not limited thereto, and the composition of the semiconductor layer may be appropriately adjusted according to an output wavelength.

The light-emitting structure 120 may include a second recess 128 and a plurality of first recesses 129, which are disposed to pass through the second conductive semiconductor layer 127 and the active layer 126 and reach a portion of the first conductive semiconductor layer 124.

The second recess 128 may extend continuously along side surfaces of the light-emitting structure 120. The second recess 128 may be a single recess extending along an outer side surface of the light-emitting structure 120 to form a closed loop, but the present invention is not limited thereto, and the second recess 128 may be divided into a plurality of recesses.

The active layer 126 may be divided into an inactive region OA1 disposed outside the second recess 128 and an active region IA1 disposed inside the second recess 128 by the second recess 128.

The plurality of first recesses 129 may be disposed inside the second recess 128. The first recess 129 may have the first electrode 142 disposed therein and serve as a path through which a current is injected into the first conductive semiconductor layer 124.

The inactive region OA1 may be a non-light emitting region in which electrons and holes are not combined, and the active region IA1 may be a region in which a current is dispersed and light is emitted.

An area of the active region IA1 disposed inside the second recess 128 may be greater than an area of the inactive region OA1 disposed outside the second recess 128.

A ratio of a maximum area of the light-emitting structure 120 to a maximum area of the second recess 128 may range from 1:0.01 to 1:0.03. When the ratio of the maximum area of the light-emitting structure 120 to the maximum area of the second recess 128 is smaller than 1:0.01, it may be difficult to prevent the oxidation of the active layer 126 by contaminants. Further, when the ratio of the maximum area of the light-emitting structure 120 to the maximum area of the second recess 128 is greater than 1:0.03, light efficiency may be lowered.

A passivation layer 180 which surrounds the side surfaces and an upper surface of the light-emitting structure 120 may be delaminated from the light-emitting structure 120 due to heat generated by operation of the semiconductor device, high temperature and humidity of the outside, and a difference in thermal expansion coefficient with the light-emitting structure 120. Alternatively, cracks or the like may be generated in the passivation layer 180.

When the passivation layer 180 is delaminated or cracked, the light-emitting structure 120 may be oxidized by external moisture or contaminants that permeate into the light-emitting structure 120 from the outside.

In the case of a UV light-emitting element, the active layer 126 has a relatively high Al composition so that the active layer 126 may be more vulnerable to oxidation. Therefore, when a sidewall of the light-emitting structure 120 is exposed by cracks or the like, the active layer 126 may be rapidly oxidized and light output may be lowered.

According to the embodiment, the second recess 128 may be disposed between the inactive region OA1 and the active region IA1 to serve as a barrier. Further, a distance between the inactive region OA1 and the active region IA1 may be increased due to the second recess 128. Therefore, even when the inactive region OA1 of the active layer 126 is oxidized, the oxidation of the active region IA1 of the active layer 126 may be prevented by the second recess 128.

Referring to FIG. 2, a first insulating layer 131 may be disposed below the light-emitting structure 120 to electrically insulate the first electrode 142 from the active layer 126 and the second conductive semiconductor layer 127.

The first insulating layer 131 may be formed of at least one selected from the group consisting of $SiO_2$, $SiO_y$, $Si_3N_4$, $SiN_y$, $SiO_xN_y$, $Al_2O_3$, $TiO_2$, AlN, and the like, but the present invention is not limited thereto. The first insulating layer 131 may be formed as a single layer or a multilayer. For example, the first insulating layer 131 may be a distributed Bragg reflector (DBR) having a multilayer structure including Si oxide or a Ti compound. However, the present invention is not limited thereto, and the first insulating layer 131 may include various reflective structures.

The first insulating layer 131 may include a second insulating portion 131b disposed inside the second recess 128 and a first insulating portion 131a disposed inside the first recess 129. The second insulating portion 131b and the first insulating portion 131a may be connected to each other on a lower surface of the second conductive semiconductor layer 127.

The first insulating portion 131a may be disposed inside the first recess 129 and a through-hole TH1 may be formed in the first insulating portion 131a. The first electrode 142 may be disposed in the through-hole TH1 of the first insulating portion 131a and may be electrically connected to the first conductive semiconductor layer 124.

The second insulating portion 131b may be disposed entirely inside the second recess 128 to electrically insulate a first conductive layer 165 and the second conductive layer 150 from the first conductive semiconductor layer 124. Therefore, a current may be hardly dispersed in the active layer 126 disposed outside the second recess 128. Further, since the second insulating portion 131b is disposed inside the second recess 128, the oxidation of a side surface of the active layer 126 may be prevented more effectively.

A height h1 of the first recess 129 may be equal to a height h1 of the second recess 128. However, the present invention is not limited thereto, and the height h1 of the first recess 129 may be different from the height h1 of the second recess 128. For example, the height h1 of the first recess 129 may be greater than the height h1 of the second recess 128. For example, the first recess 129 should be formed in a region of the first conductive semiconductor layer 124, which has a low contact resistance with the first electrode 142. On the other hand, it may be sufficient for the second recess 128 to have a height that can separate the active layer 126. Conversely, the height h1 of the second recess 128 may be greater than the height h1 of the first recess 129. In this case, a permeation path of moisture at the side surface of the light-emitting structure 120 may be elongated and thus reliability may be improved.

An inclination angle θ1 of the first recess 129 may be equal to an inclination angle θ2 of the second recess 128. However, the present invention is not limited thereto, and the inclination angle of the second recess 128 may be different from the inclination angle of the first recess 129. For example, the inclination angle of the second recess 128 may be greater than the inclination angle of the first recess 129. In this case, a width of the second recess 128 may be reduced so that the area of the active region IA1 may be increased. Alternatively, the inclination angle of the second recess 128 may be smaller than the inclination angle of the first recess 129. In this case, a distance between the active region IA1 and the inactive region OA1 of the active layer 126 may be increased so that reliability may be improved.

The first electrode 142 may be disposed inside the first recess 129 and may be electrically connected to the first conductive semiconductor layer 124. Further, the first electrode 142 may be disposed on the lower surface of the second conductive semiconductor layer 127 of the second electrode 146 to be electrically connected.

The first electrode 142 and the second electrode 146 may be ohmic electrodes. The first electrode 142 and the second electrode 146 may each include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, or Ni/IrOx/Au/ITO, Ag, Ni, Cr, Ti, Al, Rh, Pd, Ir, Sn, In, Ru, Mg, Zn, Pt, Au, Hf, and the like, but the present invention is not limited to the above materials. For example, the first electrode 142 may have a plurality of metal layers (e.g., Cr/Al/Ni), and the second electrode 146 may be ITO.

The first conductive layer 165 may include a plurality of protruding electrodes 165a which pass through the first recess 129 and the second insulating layer 132 and are electrically connected to the plurality of first electrodes 142. Therefore, the first conductive layer 165 and the plurality of first electrodes 142 may be defined as a first channel electrode.

The first conductive layer 165 may be made of a material having high reflectivity. For example, the first conductive layer 165 may include a metal such as Ti, Ni, Al, or the like. For example, when the first conductive layer 165 includes aluminum, the first conductive layer 165 may reflect UV light emitted from the active layer 126 upward.

The second conductive layer 150 may be electrically connected to the second electrode 146 and a bonding pad 166. Therefore, the bonding pad 166, the second conductive layer 150, and the second electrode 146 may form one electrical channel. Therefore, the second electrode 146 and the second conductive layer 150 may be defined as a second channel electrode.

The second conductive layer 150 may be disposed below the second electrode 146, the first insulating layer 131, the second recess 128, the light-emitting structure 120, and the bonding pad 166. Further, the second conductive layer 150 may extend into a spacing D1 between the second electrode 146 and the first insulating layer 131 and may be bonded to the first conductive semiconductor layer 124 using a Schottky junction. Therefore, current dispersion efficiency may be improved.

The second conductive layer 150 may include a material having good adhesion force to the first insulating layer 131 and may be formed of at least one material selected from a group consisting of Cr, Al, Ti, Ni, Au, and the like, or an alloy thereof and may be a single layer or a plurality of layers.

The second conductive layer 150 may be disposed between the first insulating layer 131 and the second insulating layer 132. Accordingly, the second conductive layer 150 may be protected from the permeation of external moisture or contaminants, by the first insulating layer 131 and the second insulating layer 132. Further, the second conductive layer 150 may be disposed inside the semiconductor device, and an end of the second conductive layer 150 may be surrounded by the first insulating layer 131 and the second insulating layer 132 so that the second conductive layer 150 is not exposed at an outermost side of the semiconductor device.

The second conductive layer 150 may include a first conductive region 150-1, a second conductive region 150-2, and a stepped portion 150-3. The first conductive region 150-1 may be disposed on an inner side of the second recess 128, and the second conductive region 150-2 may be disposed on an outer side of the second recess 128. That is, the first conductive region 150-1 may be disposed in the active region IA1, and the second conductive region 150-2 may be disposed in the inactive region OA1.

The stepped portion 150-3 may be disposed inside the second recess 128 and may overlap the second recess 128 and the second insulating portion 131b in a vertical direction of the light-emitting structure 120. The stepped portion 150-3 may have a shape corresponding to an inner shape of the second recess 128. For example, the stepped portion 150-3 may include inclined portions facing each other. Therefore, the stepped portion 150-3 may be bent a plurality of times along an inner inclined surface of the second recess 128.

According to the embodiment, since the second conductive layer 150 is bent by the stepped portion 150-3, an area of the second conductive layer 150 may be relatively increased so that heat dissipation performance may be improved. Further, due to an increase in adhesive force, a problem in that the second conductive layer 150 is delaminated from the light-emitting structure 120 may be addressed.

The second insulating layer 132 may electrically insulate the first conductive layer 165 from the second conductive layer 150. The first insulating layer 131 and the second insulating layer 132 may be made of the same material or may be made of different materials.

The second insulating layer 132 may be disposed in each of the second recess 128 and the first recess 129. Therefore, both of the first insulating layer 131 and the second insulating layer 132 may be disposed in the second recess 128 and the first recess 129. Therefore, even when a defect is generated in any one of the first insulating layer 131 and the second insulating layer 132, the remaining insulating layer may prevent the permeation of external moisture and/or other contaminants.

For example, when the first insulating layer 131 and the second insulating layer 132 is formed as one layer, defects such as cracks may easily propagate in a thickness direction thereof. Therefore, external moisture or the contaminants may permeate into the light-emitting structure 120 through defects exposed to the outside.

However, according to the embodiment, since the second insulating layer 132 is separately disposed on the first insulating layer 131, defects formed in the first insulating layer 131 may be difficult to propagate to the second insulating layer 132. That is, an interface between the first insulating layer 131 and the second insulating layer 132 may serve to prevent the propagation of the defects.

A bonding layer 160 may be disposed along shapes of a lower surface of the light-emitting structure 120 and the first recess 129. The bonding layer 160 may include a conductive material. For example, the bonding layer 160 may include a material selected from the group consisting of gold, tin, indium, aluminum, silicon, silver, nickel, and copper, or an alloy thereof.

The conductive substrate 170 may include a metal or a semiconductor material. The conductive substrate 170 may be a metal having high electrical conductivity and/or thermal conductivity. In this case, heat generated during operation of the semiconductor device may be rapidly dissipated to the outside. In addition, the first electrode 142 may receive a current from the outside through the conductive substrate 170.

The conductive substrate 170 may include a material selected from the group consisting of silicon, molybdenum, silicon, tungsten, copper, and aluminum, or an alloy thereof.

The passivation layer 180 may be disposed on the upper surface and the side surfaces of the light-emitting structure 120. A thickness of the passivation layer 180 may range from 200 nm to 500 nm. When the thickness of the passivation layer 180 is 200 nm or more, it is possible to protect the semiconductor device from external moisture or foreign matter, thereby improving the electrical and optical reliability of the semiconductor device, and when the thickness of the passivation layer 180 is 500 nm or less, stress applied to the semiconductor device may be reduced, and the optical and electrical reliability of the semiconductor device may be reduced or the process time of the semiconductor device may be elongated, thereby addressing a problem in that the unit cost of the semiconductor device is increased.

Uneven portions may be formed on the upper surface of the light-emitting structure 120. The uneven portions may serve to improve extraction efficiency of light emitted from the light-emitting structure 120. The uneven portions may have different average heights according to UV wavelengths. In the case of UV-C, the uneven portions may have a height in the range of about 300 nm to 800 nm, and light extraction efficiency may be improved when an average height thereof ranges from about 500 nm to 600 nm.

Referring to FIG. 3, a maximum height h3 of the first conductive layer 165 from a lowermost layer 132a in the second recess 128 may range from 0.4 µm to 0.6 µm. Further, a maximum height h5 of the second insulating layer 132 from the lowermost layer 132a in a vertical direction (a Z-axis direction) in the second recess 128 may range from 1.7 µm to 2.1 µm. Further, a maximum height h6 of the first insulating layer 131 from the lowermost layer 132a in the vertical direction in the second recess 128 may range from 2.4 µm to 2.6 µm. Further, the upper surface of the second recess 128 may have a minimum width W5 ranging from 2 µm to 8 µm in a horizontal direction.

The first insulating layer 131, the second conductive layer 150, the second insulating layer 132, and the first conductive layer 165 may be disposed in the second recess 128. Therefore, even when moisture permeates from the outside and the inactive region OA1 is oxidized, the active region IA1 may be prevented from being oxidized.

However, the present invention is not limited thereto, and the second conductive layer 150 may not be disposed in a portion of the second recess 128. In this case, the first insulating layer 131 and the second insulating layer 132 may serve as one insulating layer.

For example, the second conductive layer 150 may be disposed in the second recess facing the bonding pad 166. This is because the second conductive layer 150 should extend to an outer side of the light-emitting structure 120 and be electrically connected to the bonding pad 166. However, the second conductive layer 150 may not be formed in the second recess 128 which does not face the bonding pad. According to the above structure, since the second conductive layer 150 is not disposed in a portion of the second recess 128, the oxidation of the second conductive layer 150 may be prevented even when the inactive region is oxidized and the first insulating layer is broken.

A maximum distance between the second recess 128 and the outer side surface of the light-emitting structure 120 may range from 3 µm to 5 µm. The maximum distance may be modified according to the size of the semiconductor device or the light-emitting structure 120.

FIG. 4 is a plan view of the semiconductor device according to the first embodiment of the present invention, and FIG. 5 is an enlarged view of a portion C of FIG. 4.

Referring to FIGS. 4 and 5, the second recess 128 may be disposed along the outer side surface of the light-emitting structure 120 to form a closed loop in a plan view. Therefore, the active layer of the light-emitting structure 120 may be divided into the inactive region OA1 and the active region IA1 by the second recess 128. However, the present invention is not limited thereto, and the second recess 128 may be provided with a plurality of second recesses 128, which are disposed along an edge of the light-emitting structure 120 to be spaced apart from each other.

The inactive region OA1 may be an outer side region of the second recess 128, and the active region IA1 may be an inner side region of the second recess 128.

Electrons and holes may be injected into the active region IA1 through the first conductive semiconductor layer 124 and the second conductive semiconductor layer 127 and light having a maximum intensity in a UV wavelength band may be generated.

The inactive region OA1 may be a region in which electrons and holes are not combined. The inactive region OA1 may absorb light emitted from the active region or the outside so that excited electrons may be recombined to emit light. However, a light emission intensity of the inactive region OA1 may be much lower than a light emission intensity of the active region IA1. Alternatively, in the inactive region OA1, light may not be emitted at all. Therefore, the light emission intensity of the inactive region OA1 may be lower than the light emission intensity of the active region IA1.

The light-emitting structure 120 may be oxidized by external moisture or contaminants which permeate into the light-emitting structure 120 from the outside. Since the active layer of the UV light-emitting element has a high Al composition, the UV light-emitting element may be more vulnerable to oxidation. The second recess 128 may prevent the oxidation from being propagated to the active region IA1 when the inactive region OA1 is oxidized.

When the light-emitting structure 120 generates UV light, the light-emitting structure 120 has a high energy band gap so that a current dispersion characteristic of the light-emitting structure 120 may be degraded and an effective light-emitting region P2 may be reduced. Therefore, substantial current dispersion may occur in the active region IA1. Therefore, the semiconductor device may maintain sufficient light output even when the semiconductor device has the second recess 128.

The second conductive layer 150 may be disposed entirely in the active region IA1. Further, the second conductive layer 150 may be disposed entirely in the second recess 128 and the inactive region OA1 or may be disposed only in the second recess 128 and the inactive region OA1 of the region R1 facing the bonding pad 166.

In addition, the second recess 128 may protect the active region IA1 in which the effective light-emitting region P2 is located by limiting a region in which oxidation is caused by moisture or the like in the active layer 126 to the inactive region OA1, and thus the light output may be maintained.

The effective light-emitting region P2 may be defined as a region up to a boundary point at which a current density becomes 40% or less on the basis of the current density at the first electrode 142 having the highest current density. Further, the effective light-emitting region P2 may be defined as a region having a diameter two to five times a diameter of the first electrode 142. For example, a distance ranging from 5 µm to 40 µm away from a center of the first recess 129 may be defined as the boundary point. However, the effective light-emitting region P2 may be variably defined according to a level of the injected current and the composition of Al.

A low current density region P3, which is an outer side region of the effective light-emitting region P2, may have a low current density and may hardly contribute to light emission. Therefore, in the UV semiconductor device, light output may be improved by disposing a large number of first electrodes 142 in the low current density region P3 having a low current density.

FIG. 6 is a cross-sectional view of a semiconductor device according to a second embodiment of the present invention, FIG. 7 is a plan view of the semiconductor device according to the second embodiment of the present invention, FIG. 8A is an enlarged view of a portion C of FIG. 6, FIG. 8B shows a modified example of FIG. 8A, FIG. 9 is an enlarged view of a portion D of FIG. 6, and FIG. 10 is a plan view showing an active region and an inactive region of an active layer.

Referring to FIGS. 6 and 7, a light-emitting structure 120 may include a first outer side surface S1 and a third outer side surface S3 opposite to each other, a second outer side surface S2 and a fourth outer side surface S4 opposite to each other, and a fifth outer side surface S5 facing a bonding pad 166. In this case, the fifth outer side surface S5 may have a curvature corresponding to a shape of the bonding pad 166.

The fifth outer side surface S5 may be provided with one fifth outer side surface S5 or a plurality of fifth outer side surfaces S5. In the embodiment, the fifth outer side surface S5 may connect the first outer side surface S1 to the fourth outer side surface S4 and may connect the third outer side surface S3 to the fourth outer side surface S4.

A second recess 128 may include a 2nd-1 recess (a first sub recess) 128a, disposed along the first to fourth outer side surface S1, S2, S3, and S4 in the light-emitting structure 120, and a 2nd-2 recess (a second sub recess) 128b which extends to an inner side of the light-emitting structure 120 in the fifth outer side surface S5.

The 2nd-1 recess 128a may be disposed in the light-emitting structure 120, while the 2nd-2 recess 128b may be exposed to an outer side of the light-emitting structure 120. Therefore, an inactive region OA1 may be disposed between the 2nd-1 recess 128a and an outer side surface of the light-emitting structure 120, but the inactive region OA1 may not be disposed between the 2nd-2 recess 128b and the bonding pad 166.

Referring to FIGS. 7 and 8A, since the 2nd-1 recess 128a is disposed along a side surface of the light-emitting structure 120, the active layer 126 may include an active region IA1 disposed inside the 2nd-1 recess 128a, and an inactive region OA1 disposed outside the 2nd-1 recess 128a. According to the above configuration, the active region IA1 may be prevented from being oxidized by blocking water and moisture introduced from the outside through the side surface of the light-emitting structure 120.

A first insulating layer 131, a stepped portion 150-3 of a second conductive layer 150, and a second insulating layer 132 may be disposed in the 2nd-1 recess 128a. An area of the second conductive layer 150 may be increased by the stepped portion 150-3 disposed inside the 2nd-1 recess 128a so that heat dissipation performance may be improved. Due to an increase in adhesive force, a problem in that the second conductive layer 150 is delaminated from the light-emitting structure 120 may be addressed.

The stepped portion 150-3 may include at least three bent portions 150a, 150b, and 150c in the 2nd-1 recess 128a. Specifically, the stepped portion 150-3 may include a first bent portion 150a extending from a lower surface 121 of the light-emitting structure 120 to the 2nd-1 recess 128a, a second bent portion 150b disposed on an upper surface of the 2nd-1 recess 128a, and a third bent portion 150c extending from the 2nd-1 recess 128a to the lower surface 121 of the light-emitting structure 120. However, the number of bent portions may be variously adjusted according to a shape of the recess. Such a configuration may be applied to the embodiment of FIG. 1.

According to another embodiment, the second conductive layer 150 may not be disposed in the 2nd-1 recess 128a. In this case, the first insulating layer 131 and the second insulating layer 132 may serve as one insulating layer.

For example, the second conductive layer 150 may not be disposed in the 2nd-1 recess 128a which does not face the bonding pad 166. According to the above structure, since the second conductive layer 150 is not disposed in the 2nd-1 recess 128a, the oxidation of the second conductive layer 150 may be prevented even when the inactive region OA1 is oxidized and the first insulating layer is broken.

Referring to FIG. 8B, when the first insulating layer 131 is formed to have a thickness relatively greater than a thickness of the 2nd-1 recess 128a, an inner side of the 2nd-1 recess 128a may be mostly filled with the first insulating layer 131. Therefore, an upper surface 150-3a of the stepped portion 150-3 disposed on a lower portion of the first insulating layer 131 may be formed at a lower level than the lower surface 121 of the light-emitting structure 120 (H2<H1). In this case, the first insulating layer 131 may become thicker and the occurrence of cracks may be suppressed.

However, the present invention is not limited thereto, and a height of the stepped portion 150-3 may be determined by a thickness of the first insulating layer 131 and a size of the 2nd-1 recess 128a. For example, when the thickness of the first insulating layer 131 is relatively thin, the upper surface 150-3a of the stepped portion 150-3 may be formed at a higher level than the lower surface 121 of the light-emitting structure 120 and formed at a lower level than the active layer 126.

Further, when the thickness of the first insulating layer 131 is further increased so that the first insulating layer 131 has a flat lower surface, the stepped portion 150-3 may not be formed.

Referring to FIG. 9, the 2nd-2 recess 128b may be formed in an inner side direction from the fifth outer side surface S5 of the light-emitting structure 120. According to the above configuration, water and moisture introduced from the outside through the fifth outer side surface S5 of the light-emitting structure 120 may be blocked. Further, the area of the active layer 126 may be increased by adjusting a width of the 2nd-2 recess 128b formed in the inner side direction from the fifth outer side surface S5.

The stepped portion 150-3 of the second conductive layer 150, which overlaps the 2nd-2 recess 128b, may include two or more bent portions 150c and 150d. For example, the stepped portion 150-3 may include a fourth bent portion 150d extending from the lower surface 121 of the light-emitting structure 120 to the 2nd-2 recess 128b, and a fifth bent portion 150e bent from the upper surface of the 2nd-2 recess 128b to an outer side of the light-emitting structure 120. That is, the number of bent portions in the stepped portion 150-3 overlapping the 2nd-2 recess 128b may be smaller than the number of bent portions in the stepped portion 150-3 overlapping the 2nd-1 recess 128a.

The light-emitting structure 120 may be disposed on a conductive substrate 170. In this case, the conductive substrate 170 may include a protrusion 171 in which the bonding pad 166 is disposed. Therefore, a lower surface of the bonding pad 166 may be disposed at a higher level than the active layer 126. An inclined surface 171a of the protrusion 171 may have an angle corresponding to an inclined surface 128b-1 of the 2nd-2 recess 128b, but the present invention is not limited thereto.

The second conductive layer 150 may include an extension portion 150f extending to an outer side of the fifth outer side surface S5 of the light-emitting structure 120 and being electrically connected to the bonding pad 166. The extension portion 150f of the second conductive layer 150 may extend horizontally to an upper portion of the protrusion 171 from the upper surface 128b-2 of the 2nd-2 recess 128b. According to the above structure, a step of the second conductive layer 150 may be reduced and a step-coverage characteristic may be improved. Therefore, process reliability may be improved. Further, resistance may be lowered so that an operation voltage may be lowered. Further, the stress of the light-emitting structure 120 may be reduced so that a laser lift off (LLO) yield may be improved. Further, a degree of freedom of a mesa etch angle may be increased and the stability of the isolation process may be increased.

Referring to FIGS. 7 and 10, the active region IA1 of the active layer may be disposed inside the second recess 128, and the inactive region OA1 may be disposed outside the second recess 128. The inactive region OA1 may be disposed between the outer side surface of the light-emitting structure 120 and the second recess 128.

The inactive region OA1 may be disposed between the first outer side surface S1 and the second recess 128, between the second outer side surface S2 and the second recess 128, between the third outer side surface S3 and the second recess 128, and between the fourth outer side surface S4 and the second recess 128.

The inactive region OA1 may include a first divided region OA11 disposed on the first outer side surface of the light-emitting structure, a second divided region OA12 disposed on the second outer side surface of the light-emitting structure, a third divided region OA13 disposed on the third outer side surface of the light-emitting structure, and a fourth divided region OA14 disposed on the fourth outer side surface of the light-emitting structure. The first to third divided regions OA11, OA12, and OA13 may be connected to each other while the fourth divided region OA14 may be disposed to be spaced from the first to third divided regions OA11, OA12, and OA13. This is because the inactive region is removed by the 2nd-2 recess 128b in the fifth outer side surface S5 facing the bonding pad 166.

FIG. 11 is a plan view of a semiconductor device according to a third embodiment of the present invention, and FIG. 12 is a plan view of an active layer.

Referring to FIGS. 11 and 12, in the semiconductor device according to the embodiment, only one bonding pad 166 may be disposed. The number of bonding pads 166 may be variable according to a type of the semiconductor device and an injected current.

The second recess 128 may include a 2nd-1 recess 128a disposed along first to fourth outer side surfaces S1, S2, S3, and S4 in a light-emitting structure 120, and a 2nd-2 recess 128b extending to an inner side of the light-emitting structure 120 in a fifth outer side surface S5.

The 2nd-1 recess 128a may be disposed inside the light-emitting structure, while the 2nd-2 recess 128b may be exposed to an outer side of the light-emitting structure. Therefore, an inactive region OA1 may be disposed between the 2nd-1 recess 128a and an outer side surface of the light-emitting structure, but the inactive region OA1 may not be disposed between the 2nd-2 recess 128b and a bonding pad 166. Therefore, the inactive region OA1 of an active layer 126 may have a structure entirely connected thereto. The inactive region OA1 may be removed on the fifth outer side surface S5 facing the bonding pad 166.

FIG. 13 is a plan view of a semiconductor device according to a fourth embodiment of the present invention, and FIG. 14 is a cross-sectional view taken along line B-B of FIG. 13.

Referring to FIGS. 13 and 14, a light-emitting structure 120 may include a first outer side surface S1 and a third outer side surface S3 opposite to each other, a second outer side surface S2 and a fourth outer side surface S4 opposite to each other, and a fifth outer side surface S5 facing a bonding pad 166. In this case, the fifth outer side surface S5 may have a curvature corresponding to a shape of the bonding pad 166.

The fifth outer side surface S5 may be provided with one fifth outer side surface S5 or a plurality of fifth outer side surfaces S5. In the embodiment, the fifth outer side surface S5 may connect the first outer side surface S1 to the fourth outer side surface S4 and may connect the third outer side surface S3 to the fourth outer side surface S4.

A second recess 128 may include a 2nd-1 recess 128a disposed along the first to fourth outer side surface S1, S2, S3, and S4 in the light-emitting structure 120, and a 2nd-2 recess 128b which extends to an inner side of the light-emitting structure 120 in the fifth outer side surface S5.

The 2nd-1 recess 128a may be disposed inside the light-emitting structure 120, while the 2nd-2 recess 128b may be exposed to an outer side of the light-emitting structure 120. Therefore, an inactive region OA1 may be disposed between the 2nd-1 recess 128a and the outer side surface of the light-emitting structure 120, but the inactive region OA1 may not be disposed between the 2nd-2 recess 128b and the bonding pad 166. All of the structures described in FIGS. 6 to 10 may be applied in the present embodiment.

Outer side regions Z1 and Z2 which are spaced apart from the light-emitting structure 120 according to the embodiment may include a protruding region Z1 in which the bonding pad 166 is disposed and an outer region Z2 disposed outside the protruding region Z1, and the outer region Z2 may be concavely formed to be lower than the protruding region Z1. According to the above structure, a degree of freedom of a mesa etch angle may be increased and the stability of the isolation process may be increased.

The upper surface of the outer region Z1 may be disposed at the same height as the lower surface 121 of the light-emitting structure, but the present invention is not limited thereto. For example, the upper surface of the outer region Z12 may be disposed at a higher level or a lower level than the lower surface 121 of the light-emitting structure.

FIG. 15 is a conceptual diagram of a semiconductor device package according to an embodiment of the present invention.

Referring to FIG. 15, the semiconductor device package may include a body 2 having a groove 3 formed therein, a semiconductor device 1 disposed in the body 2, and a pair of lead frames 5a and 5b which are disposed on the body 2 and electrically connected to the semiconductor device 1. The semiconductor device 1 may include all of the configurations described above.

The body 2 may include a material or a coating layer that reflects UV light. The body 2 may be formed by stacking a plurality of layers 2a, 2b, 2c, 2d, and 2e. The plurality of layers 2a, 2b, 2c, 2d, and 2e may include the same material or may include different materials.

The groove 3 may be formed to increase in width in a direction from the semiconductor device, and steps 3a may be formed on an inclined surface of the groove 3.

Referring to FIG. 16, a semiconductor device 10 may be disposed on a first lead frame 5a and may be connected to a second lead frame 5b by a wire. In this case, the first lead frame 5a and the second lead frame 5b may be disposed to surround side surfaces of the semiconductor device 10.

A light transmitting layer 4 may cover a groove 3. The light transmitting layer 4 may be made of glass, but the present invention is not limited thereto. The light transmitting layer 4 may be made of a material as long as it can effectively transmit UV light without particular limitation. An inside of the groove 3 may be an empty space.

The semiconductor device may be applied to various types of light-emitting elements. For example, the light-emitting elements may be concepts including a sterilizing device, a curing device, a lighting device, a display device, and a vehicle lamp. That is, the semiconductor device may be applied to various electronic devices which are disposed in cases to provide light.

The sterilizing device may include the semiconductor device according to the embodiment to sterilize a desired region. The sterilizing device may be applied to household appliances such as water purifiers, air conditioners, refrigerators, and the like, but the present invention is not limited thereto. That is, the sterilizing device may be applied to various products requiring sterilization (e.g., medical apparatuses).

For example, the water purifier may include a sterilizing device according to the embodiment to sterilize circulating water. The sterilizing device may be disposed in a nozzle or an outlet through which water circulates and emit UV light. In this case, the sterilizing device may include a waterproof structure.

The curing device may include the semiconductor device according to the embodiment to cure various types of liquid. The concept of the liquids may be the broadest including all various materials which are cured when UV light is applied thereto. For example, the curing device may cure various types of resins. Alternatively, the curing device may be used for curing a cosmetic product such as a manicure.

The lighting device may include a light source module including a substrate and the semiconductor device according to the embodiment, a heat dissipating unit for dissipating heat of the light source module, and a power supply unit for processing or converting an electric signal provided from the outside to provide the electric signal to the light source module. Further, the lighting device may include a lamp, a head lamp, a streetlight, or the like.

The display device may include a bottom cover, a reflection plate, a light emitting module, a light guide plate, an optical sheet, a display panel, an image signal output circuit, and a color filter. The bottom cover, the reflection plate, the light emitting module, the light guide plate, and the optical sheet may constitute a backlight unit.

The reflection plate may be disposed on the bottom cover, and the light emitting module may emit light. The light guide plate may be disposed in front of the reflection plate to guide the light emitted from the light emitting module forward, and the optical sheet may include a prism sheet or the like and be disposed in front of the light guide plate. The display panel may be disposed in front of the optical sheet, the image signal output circuit may supply an image signal to the display panel, and the color filter may be disposed in front of the display panel.

According to the embodiment, a semiconductor device with improved reliability can be manufactured by blocking a light emitting region of the semiconductor device from external moisture or other contaminants.

Various and advantageous advantages and effects of the present invention are not limited to the above description, and can be more easily understood in descriptions of specific embodiments of the present invention.

While the present invention has been particularly described with reference to embodiments, the embodiments are only exemplary embodiments of the present invention. It will be understood by those skilled in the art that modified examples and applications in other forms may be made without departing from the spirit and scope of the present invention. For example, each element specifically shown in the embodiments may be modified and embodied. In addition, it should be understood that differences related to these modified examples and applications are within the scope of the present invention as defined in the appended claims.

What is claimed is:

1. A semiconductor device comprising:
   a light-emitting structure including a first conductive semiconductor layer, a second conductive semiconductor layer, an active layer disposed between the first conductive semiconductor layer and the second conductive semiconductor layer, and a recess passing through the second conductive semiconductor layer, the active layer, and a portion of the first conductive semiconductor layer;
   a conductive layer electrically connected to the second conductive semiconductor layer; and
   a bonding pad disposed to be spaced apart from the light-emitting structure,
   wherein the active layer is divided into an inactive region and an active region by the recess,
   the conductive layer is electrically connected to the active region, and
   the conductive layer includes a stepped portion overlapping the recess in a vertical direction.

2. The semiconductor device of claim 1, further comprising:

a first electrode electrically connected to the first conductive semiconductor layer; and
a second electrode electrically connected to the second conductive semiconductor layer,
wherein the inactive region is electrically insulated from the second electrode,
the inactive region absorbs and emits light emitted from the active region, and
a light emission intensity of the inactive region is lower than a light emission intensity of the active region.

3. The semiconductor device of claim 2, wherein:
the recess includes a plurality of first recesses in which the first electrode is disposed, and a second recess disposed along an outer side surface of the light-emitting structure; and
the active layer is divided into an inactive region and an active region by the second recess.

4. The semiconductor device of claim 3, further comprising an insulating layer disposed in the recess,
wherein the insulating layer includes a first insulating portion disposed inside the plurality of first recesses and a second insulating portion disposed inside the second recess, and
the second insulating portion overlaps the conductive layer in the vertical direction.

5. The semiconductor device of claim 4, wherein the conductive layer includes a first conductive region electrically connected to the active region and a second conductive region overlaps the inactive region in the vertical direction.

6. The semiconductor device of claim 3, wherein:
the light-emitting structure includes a first outer side surface and a third outer side surface opposite to each other, a second outer side surface and a fourth outer side surface opposite to each other, and a fifth outer side surface facing the bonding pad; and
the fifth outer side surface has a curvature corresponding to a shape of the bonding pad.

7. The semiconductor device of claim 6, wherein the inactive region is disposed between each of the first outer side surface to the fifth outer side surface and the second recess.

8. The semiconductor device of claim 7, wherein the inactive region has a closed-loop shape surrounding the active region.

9. The semiconductor device of claim 7, wherein the inactive region is disposed between each of the first outer side surface to the fourth outer side surface and the second recess.

10. The semiconductor device of claim 9, wherein the inactive region is not disposed between the fifth outer side surface and the second recess.

11. The semiconductor device of claim 9, wherein the inactive region includes a first divided region disposed between the first outer side surface and the second recess, a second divided region disposed between the second outer side surface and the second recess, a third divided region disposed between the third outer side surface and the second recess, and a fourth divided region disposed between the fourth outer side surface and the second recess.

12. The semiconductor device of claim 11, wherein:
the first to third divided regions are connected to each other; and
the fourth divided region is spaced apart from the first to third divided regions.

13. The semiconductor device of claim 11, wherein the first to fourth divided regions are connected to each other.

14. The semiconductor device of claim 7, wherein the second recess includes:
a $2^{nd}$-1 recess disposed along the first outer side surface to the fourth outer side surface in the light-emitting structure; and
a $2^{nd}$-2 recess extending to an inner side of the light-emitting structure in the fifth outer side surface.

15. The semiconductor device of claim 14, wherein:
each of a stepped portion overlapping the $2^{nd}$-1 recess and a stepped portion overlapping the $2^{nd}$-2 recess has a bent portion; and
the number of bent portions of the stepped portion overlapping the $2^{nd}$-2 recess is smaller than the number of bent portions of the stepped portion overlapping the $2^{nd}$-1 recess.

16. The semiconductor device of claim 15, wherein:
the stepped portion overlapping the $2^{nd}$-1 recess has three or more bent portions; and
the stepped portion overlapping the $2^{nd}$-2 recess has two or more bent portions.

17. The semiconductor device of claim 14, further comprising a conductive substrate in which the light-emitting structure is disposed,
wherein the conductive substrate includes a protrusion in which the bonding pad is disposed.

18. The semiconductor device of claim 17, wherein the conductive layer horizontally extends from an upper surface of the $2^{nd}$-2 recess to an upper surface of the stepped portion.

19. The semiconductor device of claim 17, further comprising:
a first conductive layer electrically connected to the first conductive semiconductor layer;
a first insulating layer disposed inside the first recess and the second recess; and
a second insulating layer disposed between the first conductive layer and the conductive layer.

20. The semiconductor device of claim 1, wherein the active region of the active layer generates light having a maximum peak at a wavelength ranging from 100 nm to 420 nm.

* * * * *